US006686810B2

(12) United States Patent
Mueller-Fiedler et al.

(10) Patent No.: US 6,686,810 B2
(45) Date of Patent: Feb. 3, 2004

(54) COPLANAR WAVEGUIDE SWITCH

(75) Inventors: Roland Mueller-Fiedler, Leonberg (DE); Thomas Walter, Renningen (DE); Markus Ulm, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/089,618

(22) PCT Filed: Jul. 20, 2001

(86) PCT No.: PCT/DE01/02757

§ 371 (c)(1),
(2), (4) Date: Jul. 17, 2002

(87) PCT Pub. No.: WO02/11232

PCT Pub. Date: Feb. 7, 2002

(65) Prior Publication Data

US 2003/0030505 A1 Feb. 13, 2003

(30) Foreign Application Priority Data

Aug. 1, 2000 (DE) .......................................... 100 37 385

(51) Int. Cl.[7] ............................ H01P 5/04; H01P 3/08; H01P 5/12; H03H 7/38

(52) U.S. Cl. ......................................... 333/33; 333/128

(58) Field of Search .......................... 333/33, 128, 202, 333/156, 161, 205; 331/99; 505/210

(56) References Cited

U.S. PATENT DOCUMENTS 5,087,896 A * 2/1992 Wen et al. .................... 331/99
5,528,203 A * 6/1996 Mohwinkel et al. ........ 333/128
6,404,304 B1 * 6/2002 Kwon et al. ................ 333/202

FOREIGN PATENT DOCUMENTS

CA 2 211 830 2/1999

OTHER PUBLICATIONS

Barker et al; Distributed MEMS True–Time Delay Phase Shifters and Wide–Band Switches; IEEE Transactions On Microwave Theory and Techniques, IEEE Inc. New York, US; Nov. 1, 1998.*

* cited by examiner

*Primary Examiner*—Patrick Wamsley
(74) *Attorney, Agent, or Firm*—Kenyon & Kenyon

(57) ABSTRACT

A device having a capacitor for changing the impedance of a section of a coplanar waveguide is provided, the capacitance of the capacitor being changeable, the signal line of the section of the waveguide being interrupted for a predefined length, a first connection connecting the ground lines of the waveguide, and the second connection connecting both parts of the interrupted signal line.

10 Claims, 2 Drawing Sheets

COPLANAR WAVEGUIDE SWITCH

BACKGROUND INFORMATION

Micromechanically manufactured high-frequency short-circuiting switches are made up of a thin metal bridge stretched between the ground lines of a coplanar waveguide. This bridge is electrostatically drawn to a thin dielectric disposed on the signal line, thereby increasing the capacitance of the plate-type capacitor formed by the bridge and the signal line. This capacitance between the signal line and the ground line influences the propagation properties of the electromagnetic waves guided on the waveguide. In the off state (the metal bridge is below), a large part of the power is reflected. In the on state (the metal bridge is above), a large part of the power is transmitted.

SUMMARY OF THE INVENTION

The device of the present invention has the advantage that the length of the metal bridge, i.e., the length of the second electrically conductive connection, is not dependent on the spacing of the ground lines of the coplanar waveguide, i.e., the spacing of the ground lines of the waveguide may be selected independently of the length of the second connection and vice versa. This results in the advantage that a high-frequency microswitch having the features, "minimal spacing of the ground lines," "high operating frequency," "large expansion of the second line, i.e., of the metal bridge," and "low switching voltage" is easily produced in accordance with the present invention. Furthermore, it is possible that the inductor serially-connected to the capacitor by the first electrically conductive connection between the ground lines of the coplanar waveguide is selected independently of the design of the signal line. As a result, it is possible using simple means to achieve a low obstruction of the propagation of the electromagnetic waves along the waveguide as well as optimal dimensioning of the first connection designed as a short-circuiting link between the ground lines and the waveguide.

It is also advantageous that the first and the second connections are metallic connections. As a result, all of the material-specific and process technology-related advantages of using metals as electrically conductive connections find a use in accordance with the present invention.

It is also advantageous that the second connection is mechanically deformable such that the spacing of the first connection and the second connection is variable in at least one partial area of the second connection. As a result, a capacitor having a variable capacitance is produced using simple means.

It is also advantageous that the capacitance of the capacitor is able to be changed by an electrostatic force between the first connection and the second connection. Therefore, simple means are able to be used to provide two circuit states of the device of the present invention, so that a reliable and quick switchability of the device is ensured. Moreover, as a result, the circuit state of the device is always clearly defined.

A further advantage is that the capacitor has a first predefined capacitance and a second predefined capacitance as a function of a predefined electrical voltage between the first connection and the second connection. As a result, it is possible to determine the operating frequency largely independently of the distance of the ground lines of the coplanar waveguide by dimensioning the first and second electrically conductive connections, in particular, and the dielectric layer between these two. The insertion attenuation (loss) is also adjustable as a result of this.

It is a further advantage that the first connection forms and inductor in series with the capacitor between the signal line and the ground lines. This makes it possible to provide different forms and dimensions for the first connection, so that the inductance resulting from the first connection is largely predefinable.

Furthermore, it is advantageous that the common impedance of the first capacitor and the inductor at an operating frequency essentially corresponds to their ohmic resistance. As a result, it is possible to achieve particularly significant insulation, i.e., a particularly large reflection coefficient, when the short-circuiting switch is switched off.

Another advantage is that approximately 77 GHz or approximately 24 GHz are provided as the operating frequency. This makes it possible to use the device of the present invention for ACC (adaptive cruise control) or SRR (short range radar) applications.

In addition, it is advantageous that the predefined length is provided such that reflections at a junction between the signal line and the second connection compensate for each other. As a result, the insertion attenuation of the switch and, thus, the adaptation in the on state are improved.

DETAILED DESCRIPTION

Figure 1:
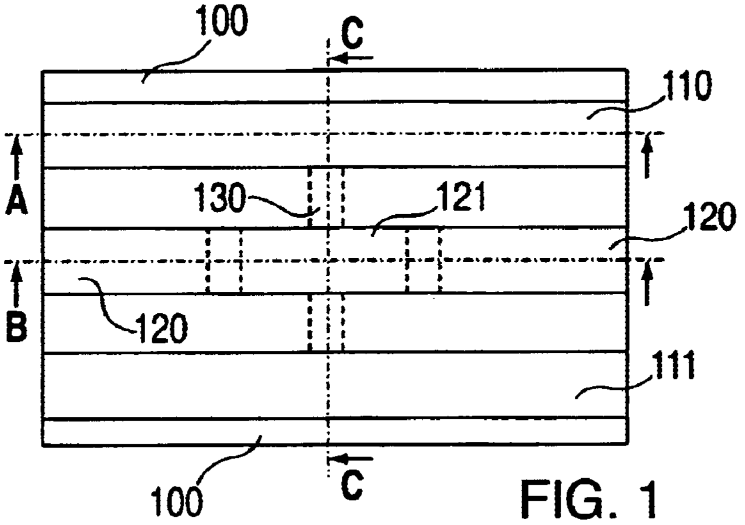
FIG. 1 shows a top view of a device of the present invention having a capacitor.

FIG. 1 shows a micromechanical high-frequency short-circuiting switch as an example of the device of the present invention having a capacitor. In the case of the device of the present invention, a coplanar waveguide is disposed on a substrate 100. In accordance with the present invention, the coplanar waveguide includes three coplanar, electrically conductive lines, in particular, which are essentially parallel to one another at least locally. The lines of the coplanar waveguide are designed to be metallic in particular and are disposed on the substrate particularly by one or more galvanic process steps. In accordance with the present invention, substrate 100 has, in particular, the characteristic of a small loss angle. The two outer lines of the three lines of the coplanar waveguide correspond to a first ground line 110 and a second ground line 111, and the middle line corresponds to a signal line 120 of the coplanar waveguide. FIG. 1 shows a top view of a detail relevant for the device of the present invention of such a coplanar waveguide disposed on substrate 100. Both ground lines 110, 111 of the coplanar waveguide are connected via a first electrically conductive connection 130. In this context, first connection 130 is disposed directly on substrate 100 and is a low in "height" in comparison with the "height" of ground lines 110, 111, i.e., first connection 130 connects to the "foot" of ground lines 110, 111 on substrate 100. Signal line 120 of the coplanar waveguide is interrupted in the region of first connection 130. Therefore, connection 130 is also not connected in an electrically conductive manner to signal line 120. In accordance with the present invention, a layer of a dielectric not shown in FIG. 1 is deposited on first connection 130 in the region of the interruption of signal line 120. Furthermore, interrupted signal line 120 is connected via a second electrically conductive connection 121. In this context, in accordance with the present invention, second connection 121 is provided in particular in the form of a metal bridge between the ends of interrupted signal line 120. However, in accordance with the present invention, second connection 121 is provided at a certain distance to the plane of substrate 100, the distance of second connection 121 to substrate 100 or to first connection 130 corresponding approximately to the height of signal line 120. As a result, in the absence of forces on second connection 121, second connection 121 "floats" between the ends of interrupted signal line 120. In this respect, second connection 121 is also referred to as bridge or metal bridge 121. FIG. 1 also shows a first line of intersection designated by the letter C, a second line of intersection designated by the letter A, and a third line of intersection designated by the letter B. The first line of intersection cuts the device of the present invention vertically with respect to the course of ground lines 110, 111 and of signal line 120 in the region of first connection 130 between ground lines 110, 111. The second line of intersection cuts the device of the present invention parallel to the course of lines 110, 111, 120 of the coplanar waveguide in the region of first ground line 110. The third line of intersection cuts the device of the present invention parallel to the course of lines 110, 111, 120 of the coplanar waveguide in the region of signal line 120 or where signal line 120 is interrupted, in the region of second connection 121.

Figure 2:
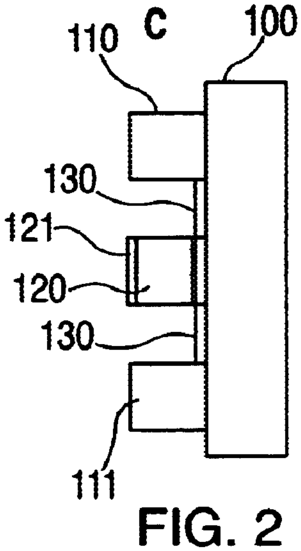
FIG. 2 shows a sectional view along line of intersection C from FIG. 1 of the device of the present invention having a capacitor.

FIG. 2 shows a sectional view of the device of the present invention along the first line of intersection (letter C) from FIG. 1. Substrate 100, first ground line 110, and second ground line 111 of the coplanar waveguide are shown in turn. Signal line 120 of the waveguide is situated between ground lines 110, 111 of the coplanar waveguide. The spatial arrangement of first connection 130 and of second connection 121 with respect to their distance from the surface of substrate 100 becomes particularly clear in FIG. 2. In FIG. 2, first connection 130 is disposed directly on substrate 100, while second connection 121 is disposed on signal line 120 and is, thus, provided at a distance equaling the height of signal line or ground lines 110, 111, 120 from the plane of substrate 100.

Figure 3:
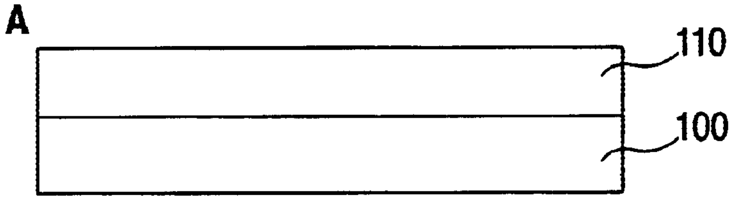
FIG. 3 shows a sectional view along intersection line A from FIG. 1 of the device of the present invention having a capacitor.

FIG. 3 shows a sectional view of the device of the present invention along line of intersection A from FIG. 1. Only substrate 100 and first ground line 110 are visible.

Figure 4:
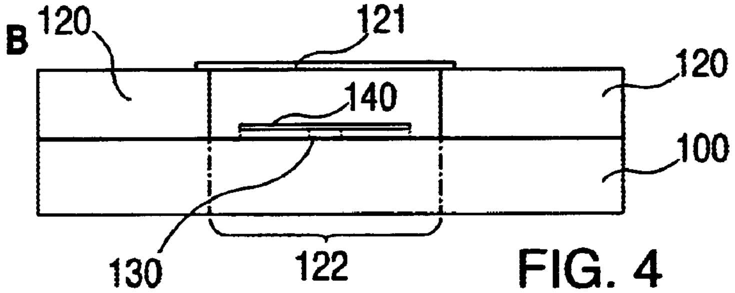
FIG. 4 shows a sectional view along line of intersection B from FIG. 1 of the device of the present invention having a capacitor.

FIG. 4 shows the device of the present invention along the third line of intersection (letter B). Signal line 120 of the coplanar waveguide is provided on substrate 100. Signal line 120 is interrupted for a predefined length 122. In this region, second connection 121 bridges signal line 120. In this context, second connection 121 connects the two ends of signal line 120 created by the interruption of signal line 120. In the exemplary embodiment, second connection 121 is provided particularly at a distance from substrate 100 corresponding to the height of signal line 120. FIG. 4 also shows first connection 130. Dielectric layer 140, which was already mentioned in connection with FIG. 1, is situated above first connection 130.

Figure 5:
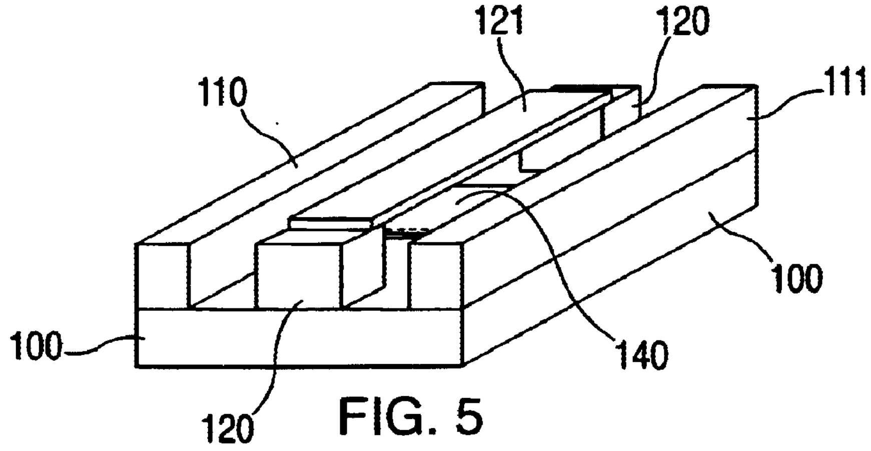
FIG. 5 shows a perspective view of the device of the present invention having a capacitor.

FIG. 5 shows a perspective view of the device according to the present invention. First ground line 110 and second ground line 111 of the waveguide are situated on substrate 100. Interrupted signal line 120 is situated between these ground lines 110, 111. Both ends of signal line 120 are bridged by second connection 121. FIG. 5 also shows dielectric layer 140. First connection 130 between ground lines 110, 111 provided below dielectric layer 140, i.e., in the direction of substrate 100, is not represented because of the perspective view in FIG. 5.

Figure 6:
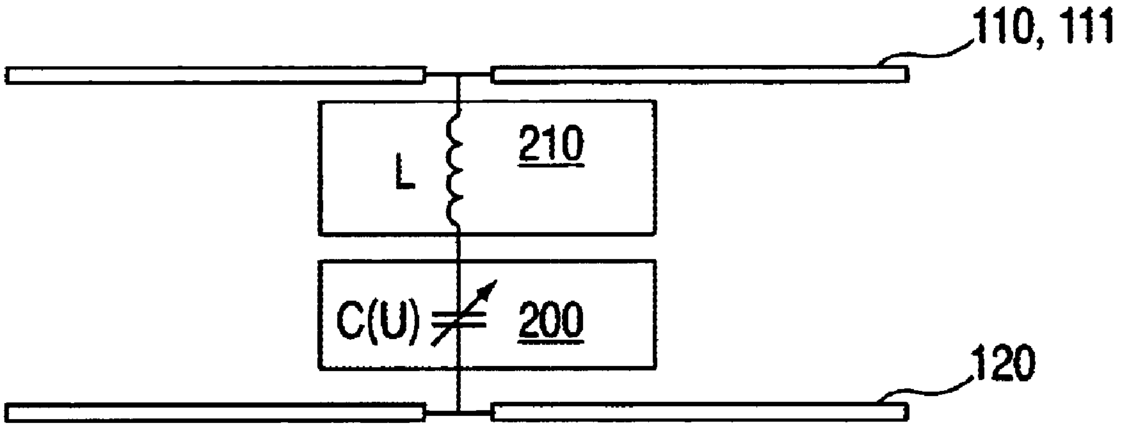
FIG. 6 shows an equivalent circuit diagram of the device of the present invention having a capacitor.

FIG. 6 shows an equivalent circuit diagram of the configuration according to the present invention. In the equivalent circuit diagram, both ground lines 110, 111 are only represented in the form of a single line of the coplanar waveguide. This is because ground lines 110, 111 are at the same potential. Signal line 120 of the coplanar waveguide is also shown in FIG. 6. A capacitor 200 and an inductor 210 are arranged in series between signal line 120 and ground lines 110, 111. Capacitor 200 is at least partially produced by first connection 130 and second connection 121, which are both not shown in FIG. 6. In accordance with the present invention, capacitor 200 is designed to have a variable capacitance, namely particularly as a result of second connection 121 being mechanically deformed and its distance to first connection 130 being consequently changed at least in partial areas, thereby influencing the capacitance of capacitor 200. Inductor 210 is essentially produced by first connection 130. Patterning first connection 130, which acts as a direct-voltage short circuit between ground lines 110, 111, produces an inductance that is specifiable by changing the length-width ratio, the form, e.g. meander-shaped or the like.

FIGS. 4 and 5 show mechanically deformable second connection 121 for the case that the represented sections of the coplanar waveguide have a high transmission coefficient and a low reflection coefficient. The spacing of first connection 130 and second connection 121, which together with the electrical properties of dielectric layer 140 largely determines the capacitance of capacitor 200, are shown with maximum distance in FIG. 4. The capacitance of capacitor 200 is very small in this case and is decisive for the input attenuation of a short-circuiting switch, for example. For the case that an electrical voltage, e.g. a direct voltage, is applied between first connection 130 and second connection 121, an electrostatic attractive force results between first connection 130 and second connection 121. Consequently, since second connection 121 is mechanically deformable, it is deformed and drawn at least in a partial area, namely essentially in the middle of the metal bridge, to first connection 130 or to dielectric layer 140 deposited on first connection 130. The dielectric, in particular silicon dioxide or silicon nitride, prevents the device configured in particular as a switch from being galvanically contacted in the off state. As a result, the capacitance of capacitor 200, which is substantially formed by first connection 130 and second connection 121, changes so that it becomes greater. In accordance with the present invention, applying or removing an electrical voltage between both connections 130, 121 changes the capacitance of capacitor 200 of the device of the present invention or switches it in the case of the device being configured as a switch. The position of second connection 121 represented in FIGS. 4 and 5 corresponds to the tandem (switched-through) operation of the device and is switched as an on state. The state not shown in FIG. 4 in which a second connection 121 is attracted by an electrical voltage to first connection 130 corresponds to a switched-off switch. This is the case because it is provided in accordance with the present invention that the waveguide, which includes sections represented in FIGS. 1 through 4, is operated at a predefined operating frequency. The capacitance of capacitor 200 assumes as a function of an electrical voltage between both connections 130, 121 two capacitance values, which are designated in the following as first capacitance value or also first capacitance and second capacitance value or also second capacitance. The first capacitance corresponds to the off state, i.e., second connection 121 is drawn to first connection 130 as a function of the applied electrical voltage. Accordingly, the second capacitance corresponds to the on state shown in FIG. 4 where second connection 121 is not mechanically deformed. In accordance with the present invention, the first capacitance and the second capacitance are determined by a variation in particular in the width and length of first connection 130 and of second connection 121 as well as in the thickness and the material properties of the dielectric layer and in the height of signal line 120. In accordance with the present invention, it is provided in particular that connections 130, 121, dielectric layer 140, and signal line 120 are dimensioned such that the impedance of a series connection of the first capacitor and an inductor formed by first connection 130 is eliminated at the operating frequency or is kept as minimal as possible. According to the present invention, inductor 210 is essentially adjusted by the dimensioning and form design of first connection 130 between ground lines 110, 111 of the waveguide.

In accordance with the present invention, second connection 121 is a thin metal bridge stretched between the ends of interrupted signal line 120 of the waveguide. First connection 130 acts as a direct-voltage short circuit between ground lines 110, 111. First connection 130 acts together with second connection 121 as a plate-type capacitor. As a result of suitable dimensioning and form design of the direct-voltage short circuit, i.e., of first connection 130, an inductor in series with the plate-type capacitor is able to be adjusted (at operating frequency). The inductor being in series with the plate-type capacitor forms a series resonant circuit whose resonant frequency in the off state of second connection 121 is at the operating frequency of the device as a result of suitably dimensioning the inductance and the capacitance of the plate-type capacitor. As a result, the impedance between signal line 120 and ground lines 110, 111 is significantly reduced with respect to the impedance of the pure plate-type capacitor (without inductance), thereby significantly improving the insulation of a device configured as a high-frequency switch. At this point, the insulation is limited by the ohmic losses in second connection 121 and in first connection 130. In an on state, as a result of the reduced capacitance of the plate-type capacitor (second connection 121 or also bridge 121 "above," i.e., at a relatively great distance from the substrate), the device or the component or structural element is operated at operating frequency outside of this resonant frequency, so that no greater insertion attenuations result. If the length of second connection 121 is suitably dimensioned (e.g. half of the effective wavelength at the operating frequency), the reflections compensate for each other at the points of contact or the junction points between the coplanar waveguide (i.e., the ends of signal line 120) and second connection 121, thereby improving the insertion attenuation of the device provided, for example, as a switch and, consequently, the adaptation. This corresponds to a transformation of the impedance of second connection 121 to the impedance of the coplanar waveguide. The length of second connection 121 is not limited by a maximum spacing of the ground lines at high operating frequencies. As a result, an increased switching voltage, i.e. the voltage to be applied between first and second connection 130, 121, does not need to be used at higher operating frequencies.

In accordance with the present invention, provision is made in particular for selecting the operating frequency in the range of approximately 77 GHz or approximately 24 GHz. As a result, the device of the present invention is suitable for applications in the area of ACC (adaptive cruise control) or SRR (short range radar).

What is claimed is:

1. A device comprising:

a capacitor for changing an impedance of a section of a coplanar waveguide, the capacitor having a changeable capacitance, the section of the waveguide having a signal line which is interrupted for a predefined length, the waveguide having ground lines; and first and second electrically conductive connections at least partially surrounded by the capacitor, the first connection connecting the ground lines of the waveguide, the second connection connecting two parts of the interrupted signal line.

2. The device according to claim 1, wherein the first connection forms an inductor in series with the capacitor between the signal line and the ground lines.

3. The device according to claim 2, wherein a common impedance of the capacitor and of the inductor at an operating frequency substantially corresponds to their ohmic resistance.

4. The device according to claim 3, wherein the operating frequency is about 77 GHz.

5. The device according to claim 3, wherein the operating frequency is about 24 Ghz.

6. The device according to claim 1, wherein the first and second connections are metallic connections.

7. The device according to claim 1, wherein the second connection is mechanically deformable such that a spacing of the first connection and the second connection is changeable at least in a partial area of the second connection.

8. The device according to claim 1, wherein a change in the capacitance of the capacitor is able to be produced by an electrostatic force between the first and second connections.

9. The device according to claim 1, wherein the capacitor has a first predefined capacitance and a second predefined capacitance as a function of a predefined electrical voltage between the first connection and the second connection.

10. The device according to claim 1, wherein the predefined length is such that reflections at a junction between the signal line and the second connection compensate for each other.

* * * * *